United States Patent [19]
Harkness et al.

[11] Patent Number: 6,001,196
[45] Date of Patent: Dec. 14, 1999

[54] LEAN, HIGH CONDUCTIVITY, RELAXATION-RESISTANT BERYLLIUM-NICKEL-COPPER ALLOYS

[75] Inventors: John C. Harkness, Lakewood; Shelley J. Wolf, Holland, both of Ohio

[73] Assignee: Brush Wellman, Inc., Cleveland, Ohio

[21] Appl. No.: 08/738,880

[22] Filed: Oct. 28, 1996

[51] Int. Cl.$^6$ ........................................... C22C 9/06
[52] U.S. Cl. ........................ 148/435; 148/433; 148/682; 420/485; 420/488
[58] Field of Search ...................... 148/435, 433, 148/682; 420/469, 473, 485, 488

[56] References Cited

U.S. PATENT DOCUMENTS

| | | | |
|---|---|---|---|
| 4,179,314 | 12/1979 | Wikle | 148/160 |
| 4,377,424 | 3/1983 | Hirao et al. | 148/414 |
| 4,425,168 | 1/1984 | Goldstein et al. | 148/160 |
| 4,551,187 | 11/1985 | Church et al. | 148/411 |
| 4,565,586 | 1/1986 | Church et al. | 148/411 |
| 4,594,221 | 6/1986 | Caron et al. | 420/414 |
| 4,599,120 | 7/1986 | Church et al. | 420/485 |
| 4,657,601 | 4/1987 | Guha | 148/414 |
| 4,724,013 | 2/1988 | Church et al. | 148/411 |
| 4,728,372 | 3/1988 | Caron et al. | 148/414 |
| 4,792,365 | 12/1988 | Matsui et al. | 148/432 |
| 4,935,202 | 6/1990 | Iwadachi | 420/486 |
| 5,037,311 | 8/1991 | Frankeny et al. | 439/66 |
| 5,651,844 | 7/1997 | Longenberger | 148/683 |

FOREIGN PATENT DOCUMENTS

| | | |
|---|---|---|
| 0 271 991 A2 | 6/1988 | European Pat. Off. . |
| 271991 | 6/1988 | European Pat. Off. . |
| 0 282 204 A1 | 9/1988 | European Pat. Off. . |
| 0 390 374 A1 | 3/1990 | European Pat. Off. . |
| 60-245751 | 12/1985 | Japan . |
| 60-245754 | 12/1985 | Japan . |
| 60-258440 | 12/1985 | Japan . |
| 61-64840 | 4/1986 | Japan . |
| 62-182240 | 8/1987 | Japan . |
| 0 130 994 8 | 12/1989 | Japan . |
| 1309948 | 12/1989 | Japan . |
| 02066131 | 3/1990 | Japan . |
| 02107732 | 4/1990 | Japan . |
| 02122035 | 5/1990 | Japan . |
| 02122039 | 5/1990 | Japan . |
| 04099835 | 3/1992 | Japan . |
| 04099839 | 3/1992 | Japan . |
| WO 80/01169 | 6/1980 | WIPO . |
| WO-A-80/01169 | 6/1980 | WIPO . |
| WO 86/05522 | 9/1986 | WIPO . |

OTHER PUBLICATIONS

Institute of Metals, Monograph and Report Series No. 34 (1970).
Chemical Abstracts AN 81:110149 (1974).
Mihajlovic et al., "Precipitation–Hardening of Cast Cu–Be–Ni–Zr Alloy", Copper and its Alloys, Proceedings of an International Conference Organized by the Institute of Metals, Amsterdam, Sep. 21–25, 1970, Monograph and Report Series 34, The Institute of Metals, 1970.
Harkness et al., "Beryllium–Copper and Other Beryllium–Containing Alloys", ASM Metals Handbook, pp. 403–423, vol. 2, Edition 10, 1990.
Almashegyi, "Preparation of Welding Electrodes with High Temperature Strength and Electrical Conductivity from Copper–Nickel–Beryllium" (Abstract only), Chemical Abstracts, vol. 81, No. 18, Nov. 4, 1974, Columbus, Ohio, Abstract No. 110149.
Harkness et al., "Atlas of Stress Relaxation Curves for Beryllium Copper and Selected Copper Alloys", Brush Wellman, 1993.
Olin, "Alloy C7025", 1992.
Joslyn et al., Handbook of Soviet Alloy Compositions, Metals and Ceramics Information Center, Publication MCIC–HB–05, revised Oct. 1980.

*Primary Examiner*—Sikyin Ip
*Attorney, Agent, or Firm*—Calfee, Halter & Griswold, LLP

[57] ABSTRACT

A higher order beryllium-nickel-copper alloy a process for making the same, and an article of manufacture comprising the alloy, the alloy being represented by the formula (0.15–0.5% Be) +(0.40–1.25% Ni)+(0–0.25% Sn)+ [(0.06–1% Zr) and/or (0.06–1% Ti)], the balance copper, where the sum of % Zr and % Ti is generally within a range of 0.06% and 1%, the alloy being characterized by improved electrical conductivity, bend formability and stress relaxation resistance without sacrificing strength.

32 Claims, No Drawings

LEAN, HIGH CONDUCTIVITY, RELAXATION-RESISTANT BERYLLIUM-NICKEL-COPPER ALLOYS

FIELD OF THE INVENTION

The present invention relates generally to alloys and more particularly to a lean alloy of beryllium-nickel-copper having high conductivity and stress relaxation resistance.

BACKGROUND OF THE INVENTION

Beryllium-copper alloys are notable for their superior combination of high conductivity, formability, strength and resistance to corrosion. For these reasons, they are considered particularly suited to the construction of electronic connectors for automobiles and lead frames for semi-conductor chips.

In conventional beryllium-copper alloys, cobalt has been used as an additive to improve strength. In this connection, nickel has also been added, alternatively or concurrently with cobalt, with the added benefit of increasing the alloy's conductivity. In an attempt to lower cost, decreased beryllium content has been considered. However, the results have been concurrent loss of strength, formability, stress relaxation resistance, and in some cases conductivity.

SUMMARY OF THE INVENTION

It is therefore an object of the present invention to provide a high performance beryllium-nickel-copper alloy with superior stress relaxation resistance without sacrificing formability, conductivity or strength.

Another object of the present invention is to provide a high performance alloy with superior electrical conductivity.

A further object of the present invention is to provide a lower cost beryllium-nickel-copper alloy with enhanced mechanical properties.

Still another object of the present invention is to provide a method of producing beryllium-nickel-copper alloys which improves bend formability without sacrificing other desirable alloy characteristics.

Yet another object of the present invention is to provide simple, efficient and economical production of novel high performance alloys using conventional methods.

A further object of the present invention is to provide a lean alloy of beryllium-nickel-copper while enhancing its properties.

Yet a further object of the present invention is to improve performance of electronic connectors.

Still another object of the present invention is to enhance performance of semi-conductor lead frames.

Another object of the present invention is to enable direct recycling of tin-plated scrap upon processing beryllium-nickel-copper alloys without the expense of chemical detinning and while retaining a high degree of hot workability.

According to one aspect of the present invention is a higher order beryllium-nickel-copper alloy represented by the formula (0.15–0.5% Be)+(0.40–1.25% Ni)+(0–0.25% Sn)+(0.06–1% Zr), the balance copper, characterized by improved electrical conductivity, bend formability and stress relaxation resistance without sacrificing strength.

In accordance with another aspect of the present invention is a higher order beryllium-nickel-copper alloy represented by the formula (0.15–0.5% Be)+(0.40–1.25% Ni)+(0–0.25% Sn)+(0.06–1% Ti), the balance copper, characterized by improved electrical conductivity, bend formability and stress relaxation resistance without sacrificing strength.

In accordance with a further aspect of the present invention is a higher order beryllium-nickel-copper alloy represented by the formula (0.15–0.5% Be)+(0.40–1.25% Ni)+(0–0.25% Sn)+(0.06–1% Zr)+(0.06–1% Ti), the balance copper, where the sum of % Zr and % Ti is generally within a range of 0.06% and 1%, the alloy being characterized by improved electrical conductivity, bend formability and stress relaxation resistance without sacrificing strength.

In accordance with still another aspect of the present invention is a method of producing a lean beryllium-nickel-copper alloy with tin and zirconium and/or titanium additions represented by the formula (0.15–0.5% Be)+(0.40–1.25% Ni)+(0–0.25% Sn)+[(0.06–1% Zr) and/or (0.06–1% Ti)], the balance copper, where the sum of % Zr and % Ti is generally within a range of 0.06% and 1%, the method comprising the steps of: (i) melting a composition represented by the formula, (ii) casting the melt into billets, (iii) hot rolling the billets into strip, (iv) cold rolling the strip to a selected ready-to-finish thickness, (v) final solution annealing the cold rolled strip at a temperature generally within a range of 1550° F. and 1700° F. followed by rapid quenching, (vi) cold working the annealed strip generally within a range of 0% and 90% to final thickness, and (vii) final age hardening the cold worked strip at a temperature generally within a range of 750° F. and 950° F. for a time generally within a range of 1 and 16 hrs.

In accordance with still a further aspect of the present invention is a method of producing a lean beryllium-nickel-copper alloy with tin and zirconium and/or titanium additions represented by the formula (0.15–0.5% Be)+(0.40–1.25% Ni)+(0–0.25% Sn)+[(0.06–1% Zr) and/or (0.06–1% Ti)], the balance copper, where the sum of % Zr and % Ti is generally within a range of 0.06% and 1%, the method comprising the steps of: (i) melting a composition represented by the formula, (ii) casting the melt into billets, (iii) hot rolling the billets into strip, (iv) intermediate annealing the hot rolled strip to improve formability, (v) cold rolling the strip to a selected ready-to-finish thickness, (vi) final solution annealing the cold rolled strip at a temperature generally within a range of 1550° F. and 1700° F. followed by rapid quenching, (vii) cold working the annealed strip generally within a range of 0% and 90% to final thickness, and (viii) final age hardening the cold worked strip at a temperature generally within a range of 750° F. and 950° F. for a time generally within a range of 1 and 16 hrs.

In accordance with yet another aspect of the present invention is a method of producing a lean beryllium-nickel-copper alloy with tin and zirconium and/or titanium additions represented by the formula (0.15–0.5% Be)+(0.40–1.25% Ni)+(0–0.25% Sn)+[(0.06–1% Zr) and/or (0.06–1% Ti)], the balance copper, where the sum of % Zr and % Ti is generally within a range of 0.06% and 1%, the method comprising the steps of: (i) melting a composition represented by the formula, (ii) casting the melt into billets, (iii) hot rolling the billets into strip, (iv) cold rolling the hot rolled strip to an intermediate thickness, (v) intermediate annealing the cold rolled strip, (vi) cold rolling the annealed strip to a selected ready-to-finish thickness, (vii) final solution annealing the cold rolled strip to improve bend formability, (viii) cold working the annealed strip generally within a range of 0% and 90% to final thickness, and (ix) final age hardening the cold worked strip at a temperature generally within a range of 750° F. and 950° F. for a time generally within a range of 1 and 16 hrs.

Although the present invention is shown and described in connection with beryllium-nickel-copper alloys, it may be adapted for improving characteristics of other precipitation hardenable materials such as aluminum-based alloys and other copper or nickel-based alloys.

Still other objects and advantages of the present invention will become apparent from the following description of the preferred embodiments.

DETAILED DESCRIPTION OF THE PREFERRED EMBODIMENTS

The present invention relates to the discovery of a unique combination of constituents which, when added to beryllium-nickel-copper alloys, not only reduces the proportion of beryllium necessary to maintain the alloys' performance, but also improves properties of the material.

Such materials have been found particularly desirable for use in lead frames and electronic connectors for high technology applications. Exemplary lead frames are shown, for example, in U.S. Pat. Nos. 5,437,096 and 5,525,836, which issued on Aug. 1, 1995 and Jun. 11, 1996, respectively, the disclosures of which are hereby incorporated by reference in their entirety. Sample electronic connectors are set forth in U.S. Pat. No. 5,037,311, which issued on Aug. 6, 1991 and in the "Connector Engineering Design Guide"—Material Selection in the Design of Spring Contacts and Interconnection, by Brush Wellman Inc.—Technical Staff, July, 1995, the disclosures of which are hereby incorporated by reference in their entirety.

To illustrate, circuit integrity in electronic connectors often depends upon maintenance of a minimum contact normal force over the life of a mated connector. During operation of the connector at elevated temperatures, a phenomenon known as "stress relaxation" may occur. Stress relaxation, by one definition, is a thermally-activated loss in normal force at a constant spring deflection over time at an elevated temperature. It has been found that connectors which require a specified minimum normal force for electrical continuity must necessarily be overdesigned with respect to the normal force at room temperature, in order to compensate for any expected time-dependent stress loss through relaxation at usual operating temperatures.

An undesirable side effect of "overdesigning" is an increase in insertion force. Alloys with a high stress relaxation resistance not only allow the use of a lower insertion force but also enable thinner strip and/or smaller spring beams to be used, thereby reducing cost. And, this is done without sacrificing contact performance.

Stress relaxation is normally measured on tapered cantilever beam specimens, deflected in a fixture to impart an initial stress that is a predetermined fraction of the 0.2% offset yield strength at room temperature of the strip being tested. Stress relaxation is measured as the "% remaining" initial stress after exposure for various times (as long as about 1000 hrs. and, in some cases, up to about 10,000 hrs.) at a selected temperature.

Stress relaxation resistance typically falls within three categories among conductive spring alloys, depending on the strengthening mechanism at work in the alloy. The lowest grade relaxation resistance is found in copper alloys strengthened only by solid solution and cold work (e.g., C26000 brass and C51000 phosphor bronze). Next are precipitation (nucleation and growth) hardened copper alloys (e.g., C17200, C17510, C17500, C17410, and C7025) whose heat treated strength generation offer significantly higher stress relaxation resistance. Further increase in relaxation resistance has been found in copper alloys strengthened by spinodal decomposition (or spinodal alloys) in response to heat treatment (e.g., C72900 and 4 wt. % Ti-Cu).

Another significant parameter is bend formability. Bend formability is the minimum punch radius without cracking "R" divided by the strip thickness "t" when bent by a male punch in a 90 degree V-block under conditions of "plane strain" (specimen width to thickness ratio much greater than about 8:1).

The foregoing discussion is provided for purposes of illustration and is not intended to limit the intended environment. The remaining aspects of connectors and lead frames are known by those skilled in the art and further description is believed unnecessary for illustration of the present invention.

In accordance with one aspect of the present invention is a higher order beryllium-nickel-copper alloy represented by the formula (0.15–0.5% Be)+(0.40–1.25% Ni)+(0–0.25% Sn)+(0.06–1% Zr), the balance copper. Such alloys are advantageous in having improved electrical conductivity, bend formability and stress relaxation resistance, but without sacrificing strength.

According to another aspect of the present invention is a higher order beryllium-nickel-copper alloy represented by the formula (0.15–0.5% Be)+(0.40–1.25% Ni)+(0–0.25% Sn)+(0.06–1% Ti), the balance copper. This alloy is similarly characterized by improved electrical conductivity, bend formability and stress relaxation resistance. Again, strength is not sacrificed.

Alternatively, an alloy is provided represented by the formula (0.15–0.5% Be)+(0.40–1.25% Ni)+(0–0.25% Sn)+(0.06–1% Zr)+(0.06–1% Ti), the balance copper. With this alloy, the sum of % Zr and % Ti is generally within a range of 0.06% and 1%. As before, electrical conductivity, bend formability and stress relaxation resistance are improved, and strength is maintained.

Generally speaking, the foregoing combinations and constituent ranges have consistently improved properties of beryllium-nickel-copper alloys for purposes of high performance applications. Such alloys not only provide strength comparable to conventional alloys, but also improved formability, conductivity and stress relaxation resistance over competitive alloys such as C7025, C7026 and other heat treated copper-based alloys for strip products. It is noted, the percent of each constituent is preferably weight based, as will be appreciated by those skilled in the art.

Referring now to Table I, there are provided specific, illustrative compositions and methods according to the present invention. Each composition was first induction melted in air in a commercial-scale furnace and semi-continuously cast into strip billets about 7 inches thick nominal. Conventional manufacturing processes were then employed to convert the cast billets to strip, as follows.

In accordance with one aspect of the present invention, lean beryllium-nickel-copper alloys with tin and zirconium and/or titanium additions are produced. The alloys are represented by the formula (0.15–0.5% Be)+(0.40–1.25% Ni)+(0–0.25% Sn)+[(0.06–1% Zr) and/or (0.06–1% Ti)], the balance copper, where the sum of % Zr and % Ti is generally within a range of 0.06% and 1%. The method comprises the steps of: (i) melting a composition represented by the formula, (ii) casting the melt into billets, (iii) hot rolling the billets into strip, (iv) cold rolling the strip to a selected ready-to-finish thickness, (v) final solution annealing the cold rolled strip at a temperature generally within a range of 1550° F. and 1700° F. followed by rapid quenching, (vi) cold working the annealed strip generally within a range of 0% and 90% to final thickness, and (vii) final age hardening the cold worked strip at a temperature generally within a range of 750° F. and 950° F. for a time generally within a range of 1 and 16 hrs.

TABLE I

ALLOYS, PROCESSING AND PROPERTIES

| Heat Num. | Be (wt %) | Ni (wt %) | Sn (wt %) | Zr (wt %) | Other (wt %) | Inter-med. Ann.* (F) | Final Ann. (F) | Cold Wrk (%) | Final Age Hard (F)/#hr | 0.2% YS (ksi) | UTS (ksi) | Elong (%) | Elect Cond. % IACS | Good Way Bend (R/t) | Bad Way Bend (R/t) | Strs. Rem (%)* |
|---|---|---|---|---|---|---|---|---|---|---|---|---|---|---|---|---|
| 1 | 0.12 | 0.48 | 0.120 | — | — | No | 1550 | 20 | 850/16 | 45.6 | 65.5 | 15.7 | — | — | — | — |
|  |  |  |  |  |  |  | 1550 | 0 | 950/5 | 48.2 | 64.3 | 14.8 | 61.9 | 0 | 0 | — |
|  |  |  |  |  |  |  | 1600 | 20 | 750/5 | 70.7 | 86.2 | 12.0 | 58.3 | 0.38 | 0.31 | — |
|  |  |  |  |  |  |  | 1700 | 20 | 850/5 | 80.7 | 91.4 | 6.0 | 66.0 | 0.50 | 0.31 | — |
| 2 | 0.19 | 0.50 | 0.125 | 0.081 | — | No | 1650 | 20 | 750/5 | 84.2 | 102.2 | 15.0 | 59.1 | 0.38 | 0.25 | — |
|  |  |  |  |  |  |  | 1650 | 20 | 950/5 | 74.6 | 86.7 | 12.0 | 61.4 | 0.75 | 0.38 | — |
|  |  |  |  |  |  |  | 1700 | 0 | 750/5 | 64.3 | 96.7 | 20.0 | 50.5 | 0.30 | 0 | — |
|  |  |  |  |  |  |  | 1700 | 0 | 950/5 | 62.4 | 88.6 | 18.0 | 62.0 | — | — | — |
| 3 | 0.18 | 0.76 | 0.180 | 0.069 | — | No | 1600 | 20 | 750/5 | 92.4 | 111.0 | 14.0 | 57.1 | 0.75 | 0.25 | — |
|  |  |  |  |  |  |  | 1650 | 0 | 750/5 | 67.2 | 100.7 | 20.0 | 54.4 | 0.60 | 0 | — |
|  |  |  |  |  |  |  | 1650 | 20 | 750/5 | 93.1 | 112.0 | 14.0 | 57.2 | 0.88 | 0.38 | — |
|  |  |  |  |  |  |  | 1700 | 0 | 750/5 | 71.2 | 103.9 | 20.0 | 54.3 | 0.70 | 0 | — |
|  |  |  |  |  |  |  | 1650 | 0 | 950/5 | 70.5 | 94.4 | 20.0 | 61.5 | — | — | 83 |
|  |  |  |  |  |  |  | 1650 | 20 | 950/5 | 82.6 | 93.7 | 11.0 | 63.1 | 1.00 | 0.63 | — |
| 4 | 0.22 | 0.43 | 0.22 | 0.13 | — | No | 1600 | 20 | 750/5 | 80.8 | 99.8 | 16.0 | 54.6 | 0.38 | 0.25 | — |
|  |  |  |  |  |  |  | 1650 | 0 | 750/5 | 61.3 | 93.0 | 22.0 | 55.0 | 0.10 | 0 | — |
|  |  |  |  |  |  |  | 1650 | 20 | 750/5 | 83.0 | 101.8 | 15.0 | 54.4 | 0.38 | 0.25 | — |
|  |  |  |  |  |  |  | 1700 | 0 | 750/5 | 60.9 | 93.9 | 22.0 | 53.2 | 0 | 0 | — |
|  |  |  |  |  |  |  | 1650 | 0 | 950/5 | 56.4 | 83.4 | 18.0 | 56.2 | 0.22 | 0.43 | — |
| 5 |  |  |  |  |  |  |  |  |  |  |  |  |  |  |  |  |
| 5A | 0.22 | 0.74 | — | 0.146 | — | No | 1700 | 20 | 750/5 | 105.6 | 121.3 | 8.9 | 54.3 | 0.75 | 0.38 | 85. |
| 5C | 0.22 | 0.74 | — | — | — | No | 1700 | 20 | 750/5 | 107.4 | 121.1 | 7.0 | 54.4 | 0.88 | 0.38 | 76. |
| 6 |  |  |  |  |  |  |  |  |  |  |  |  |  |  |  |  |
| 6A | 0.23 | 0.73 | 0.107 | 0.128 | — | No | 1700 | 20 | 750/5 | 100.8 | 117.8 | 12.8 | 53.5 | 0.50 | 0.38 | 93. |
| 6C | 0.23 | 0.73 | — | — | — | No | 1700 | 20 | 950/5 | 82.7 | 95.2 | 9.8 | 59.8 | 1.25 | 0.62 | 86. |
|  |  |  |  |  |  | No | 1700 | 20 | 750/5 | 100.8 | 116.7 | 8.0 | 53.0 | 0.75 | 0.50 | 85. |
|  |  |  |  |  |  | No | 1700 | 20 | 950/5 | 85.4 | 99.4 | 8.6 | 57.1 | 0.75 | 0.5 | 88. |
| 7 | 0.24 | 0.74 | 0.130 | 0.160 | — | No | 1650 | 0 | 700/8 | 39.9 | 69.7 | 21.8 | — | — | — | — |
|  |  |  |  |  |  |  |  |  | 750/8 | 53.7 | 83.8 | 20.1 | — | — | — | — |
|  |  |  |  |  |  |  |  |  | 850/1 | 86.2 | 104.5 | 13.5 | — | — | — | — |
|  |  |  |  |  |  |  |  |  | 850/2 | 90.0 | 104.9 | 12.6 | — | — | — | — |
|  |  |  |  |  |  |  |  |  | 850/6 | 91.5 | 103.9 | 11.4 | — | — | — | — |
|  |  |  |  |  |  |  |  |  | 850/16 | 91.2 | 102.8 | 10.6 | — | — | — | — |
|  |  |  |  |  |  |  |  |  | 950/1 | 74.1 | 98.0 | 16.6 | — | — | — | — |
|  |  |  |  |  |  |  |  |  | 950/8 | 64.5 | 87.1 | 15.6 | — | — | — | — |
| 8 | 0.24 | 1.04 | 0.245 | 0.117 | — | No | 1550 | 0 | 750/5 | 71.7 | 98.5 | — | — | 0 | 0 | — |
|  |  |  |  |  |  |  | 1550 | 0 | 950/5 | 78.3 | 96.2 | 16.0 | 53.9 | 0.40 | 0.40 | — |
|  |  |  |  |  |  |  | 1650 | 0 | 950/5 | 82.5 | 103.1 | 16.0 | 53.8 | — | — | — |
| 9 |  |  |  |  |  |  |  |  |  |  |  |  |  |  |  |  |
| 9B | 0.22 | 1.19 | — | 0.113 | — | No | 1700 | 20 | 750/5 | 114.0 | 129.3 | 11.1 | 50.8 | 0.75 | 0.50 | — |
| 9C | 0.22 | 1.19 | — | — | — | No | 1700 | 20 | 750/5 | 113.8 | 129.7 | 11.8 | 50.7 | 0.75 | 0.88 | — |
| 10 |  |  |  |  |  |  |  |  |  |  |  |  |  |  |  |  |
| 1B | 0.24 | 1.18 | 0.128 | 0.179 | — | No | 1700 | 20 | 750/5 | 115.5 | 130.0 | 10.9 | 49.8 | 1.25 | 0.63 | — |
| 1C | 0.24 | 1.18 | 0.128 | — | — | No | 1700 | 20 | 750/5 | 115.5 | 130.3 | 11.3 | 49.6 | 1.25 | 0.75 | — |
| 11 | 0.28 | 0.69 | 0.27 | 0.160 | — | No | 1600 | 20 | 750/5 | 96.5 | 115.7 | 14.0 | 51.4 | 0.63 | 0.38 | — |
|  |  |  |  |  |  |  | 1650 | 0 | 750/5 | 75.6 | 108.5 | 16.0 | 49.2 | 0.30 | 0 | — |
|  |  |  |  |  |  |  | 1650 | 20 | 750/5 | 98.4 | 116.9 | 14.0 | 50.9 | 0.63 | 0.38 | — |
|  |  |  |  |  |  |  | 1700 | 0 | 750/5 | 75.6 | 110.0 | 18.0 | 49.2 | 0.30 | 0 | — |
|  |  |  |  |  |  |  | 1650 | 0 | 950/5 | 66.0 | 94.7 | 22.0 | 53.7 | 0.90 | 0.40 | — |
|  |  |  |  |  |  |  | 1650 | 20 | 950/5 | 81.8 | 94.6 | — | 55.0 | 0.63 | 0.25 | — |
| 12 | 0.24 | 0.79 | 0.179 | 0.151 | — | No | 1550 | 10 | 900/5 | 86.3 | 103.8 | 15.1 | — | — | — | — |
|  |  |  |  |  |  | HR & | 1600 | 10 | 850/5 | 88.1 | 109.5 | 18.0 | 55.3 | 0.34 | 0 | — |
|  |  |  |  |  |  | WQ | 1650 | 20 | 850/5 | 96.5 | 113.3 | 13.0 | 55.2 | 0.86 | 0 | — |
|  |  |  |  |  |  |  | 1550 | 0 | 900/5 | 77.3 | 97.3 | 15.0 | 55.6 | — | — | — |
|  |  |  |  |  |  |  | 1600 | 10 | 850/5 | 90.3 | 111.3 | 18.0 | 56.4 | 0.45 | 0 | — |
|  |  |  |  |  |  |  | 1650 | 20 | 850/5 | 100.9 | 114.5 | 11.0 | 56.1 | 0.65 | 0 | — |
| 13 | 0.26 | 0.75 | 0.208 | 0.123 | — | 1550 (0.075 in.) | 1550 | 10 | 900/5 | 81.7 | 100.1 | 11.1 | — | — | — | — |
|  |  |  |  |  |  |  | 1650 | 10 | 850/5 | 80.5 | 102.8 | 18.0 | 54.0 | 0 | 0 | — |
|  |  |  |  |  |  |  | 1650 | 20 | 850/5 | 89.5 | 106.4 | 13.0 | 53.8 | 0 | 0 | — |
| 14 | 0.26 | 0.72 | 0.201 | 0.130 | — | 1600 (0.300 in.) | 1550 | 10 | 850/5 | 82.0 | 103.5 | 21.0 | — | 0 | 0 | — |
|  |  |  |  |  |  |  | 1600 | 10 | 850/5 | 83.4 | 107.0 | 17.0 | 52.3 | 0.11 | 0.22 | — |
|  |  |  |  |  |  |  | 1650 | 20 | 850/5 | 91.7 | 109.3 | 13.0 | 52.7 | 0.13 | 0.25 | — |
|  |  |  |  |  |  | 1700 (0.300 in) | 1650 | 0 | 950/5 | 77.7 | 103.8 | 20.0 | 61.9 | — | — | 83. |
|  |  |  |  |  |  |  | 1550 | 30 | 850/5 | 91.6 | 105.4 | 13.6 | — | 0.57 | 0.57 | — |
|  |  |  |  |  |  |  | 1550 | 40 | 850/5 | 95.2 | 106.7 | 12.1 | — | 0.50 | 0.75 | — |
|  |  |  |  |  |  |  | 1550 | 50 | 850/5 | 96.3 | 107.0 | 11.7 | — | 0.50 | 0.60 | — |
|  |  |  |  |  |  |  | 1550 | 60 | 850/5 | 98.5 | 108.0 | 8.7 | — | 0 | 0.75 | — |
|  |  |  |  |  |  |  | 1550 | 80 | 850/5 | 93.0 | 103.0 | 9.2 | — | — | — | — |

TABLE I-continued

ALLOYS, PROCESSING AND PROPERTIES

| Heat Num. | Be (wt %) | Ni (wt %) | Sn (wt %) | Zr (wt %) | Other (wt %) | Intermed. Ann.* (F) | Final Ann. (F) | Cold Wrk (%) | Final Age Hard (F)/#hr | 0.2% YS (ksi) | UTS (ksi) | Elong (%) | Elect Cond. % IACS | Good Way Bend (R/t) | Bad Way Bend (R/t) | Strs. Rem (%)** |
|---|---|---|---|---|---|---|---|---|---|---|---|---|---|---|---|---|
|    |      |      |       |       |   |    | 1550 | 90 | 850/5  | 86.0  | 92.6  | 5.6  | —    | —    | —    | — |
| 15 | 0.27 | 1.05 | 0.118 | 0.132 | — | No | 1650 | 0  | 850/1  | 99.6  | 115.0 | 12.9 | —    | —    | —    | — |
|    |      |      |       |       |   |    | 1650 | 0  | 850/2  | 99.4  | 114.4 | 12.2 | —    | —    | —    | — |
|    |      |      |       |       |   |    | 1650 | 0  | 850/8  | 100.8 | 112.2 | 10.3 | —    | —    | —    | — |
|    |      |      |       |       |   |    | 1650 | 0  | 850/16 | 101.4 | 111.6 | 9.8  | —    | —    | —    | — |
|    |      |      |       |       |   |    | 1600 | 20 | 750/5  | 103.0 | 120.1 | 17.0 | 55.1 | 0.75 | 0.38 | — |
|    |      |      |       |       |   |    | 1650 | 20 | 750/5  | 106.5 | 124.2 | 15.0 | 53.8 | 1.13 | 0.63 | — |
|    |      |      |       |       |   |    | 1700 | 0  | 750/5  | 87.1  | 120.3 | 19.0 | 50.9 | 1.40 | 0    | — |
|    |      |      |       |       |   |    | 1700 | 20 | 750/5  | 81.0  | 109.8 | 15.0 | 59.3 | —    | —    | — |
| 16 | 0.31 | 0.50 | 0.130 | 0.078 | — | No | 1600 | 20 | 750/5  | 90.8  | 110.9 | 12.0 | 53.0 | 0.50 | 0.13 | — |
|    |      |      |       |       |   |    | 1650 | 20 | 750/5  | 69.3  | 104.5 | 20.0 | 51.1 | 0.20 | 0    | — |
|    |      |      |       |       |   |    | 1700 | 0  | 750/5  | 68.6  | 102.2 | 20.0 | 50.5 | 0    | 0    | — |
|    |      |      |       |       |   |    | 1700 | 20 | 750/5  | 56.7  | 87.5  | 20.0 | 54.2 | —    | —    | — |
| 17 | 0.32 | 0.73 | 0.128 | 0.115 | — | No | 1700 | 20 | 750/5  | 110.4 | 127.2 | 12.1 | 47.2 | 0.75 | 0.50 | — |
| 18 | 0.33 | 0.77 | —     | 0.125 | — | No | 1700 | 20 | 750/5  | 111.4 | 128.7 | 11.5 | 50.0 | 0.75 | 0.50 | — |
| 19 | 0.32 | 0.89 | 0.13  | —     | — | No | 1550 | 0  | 550/5  | 63.4  | 87.6  | 20.4 | —    | —    | —    | — |
|    |      |      |       |       |   |    | 1550 | 20 | 850/5  | 90.2  | 103.6 | 13.9 | 50.7 | —    | —    | — |
|    |      |      |       |       |   |    | 1650 | 10 | 850/5  | 93.1  | 115.7 | 15.6 | 49.5 | —    | —    | — |
|    |      |      |       |       |   |    | 1650 | 20 | 750/5  | 105.5 | 123.0 | 13.9 | —    | —    | —    | — |
|    |      |      |       |       |   |    | 1650 | 20 | 950/5  | 84.3  | 99.5  | 11.3 | —    | —    | —    | — |
| 20 |      |      |       |       |   |    |      |    |        |       |       |      |      |      |      |   |
| 20A | 0.33 | 1.22 | — | 0.152 | — | No | 1700 | 20 | 750/5 | 119.4 | 135.6 | 10.5 | 48.9 | 0.75 | 0.50 | 85. |
| 20C | 0.33 | 1.22 | — | —     | — | No | 1700 | 20 | 750/5 | 116.7 | 133.3 | 11.8 | 49.2 | 0.88 | 0.88 | 76. |
| 21 |      |      |       |       |   |    |      |    |        |       |       |      |      |      |      |   |
| 21A | 0.32 | 1.20 | 0.141 | 0.158 | — | No | 1700 | 20 | 750/5 | 119.7 | 135.5 | 11.6 | 47.4 | 0.75 | 0.63 | — |
| 21C | 0.32 | 1.20 | 0.141 | —     | — | No | 1700 | 20 | 750/5 | 111.1 | 127.0 | 13.5 | 48.3 | 0.75 | 0.50 | 78. |
| 22  | 0.28 | 0.71 | —     | —     | — | No | 1700 | 60 | 750/5 | 96.8  | 111.3 | 14.3 | 55.9 | —    | —    | 77. |
| 23  | 0.26 | 0.75 | —     | —     | 0.46 Ti | No | 1700 | 60 | 750/5 | 76.6 | 84.7 | 7.8 | 30.9 | — | — | 97. |
| 24  | 0.32 | 0.77 | —     | —     | 1.00 Ti | No | 1700 | 60 | 750/5 | 105.5 | 111.7 | 8.1 | 25.7 | — | — | 97. |
| 25  | 0.27 | 0.75 | —     | 0.47  | — | No | 1700 | 60 | 750/5 | 86.2  | 99.2  | 11.8 | 52.3 | —    | —    | 96. |
| 26  | 0.32 | 0.78 | —     | 1.12  | — | No | 1600 | 20 | 850/5 | 70.4  | 85.5  | 12.0 | 54.5 | —    | —    | — |

(*Note: "No" Intermediate Anneal = Air Cool at Hot Roll + CR + Final Anneal
(**Note % Stress Remaining after 1000 hr at 175 C. and Initial Stress of 75% of 0.2% YS)

According to another aspect of the present invention is a method of producing alloys represented by the formula (0.15–0.5% Be)+(0.40–1.25% Ni)+(0.25% Sn)+[(0.06–1% Zr) and/or (0.06–1% Ti)], the balance copper. Again, the sum of % Zr and % Ti is generally within a range of 0.06% and 1%. The method, however, comprises the steps of: (i) induction melting a composition represented by the formula, (ii) casting the induction melt into billets, (iii) hot rolling the billets into strip, (iv) intermediate annealing the hot rolled strip to improve bend formability, (v) cold rolling the annealed strip to a selected ready-to-finish thickness, (vi) final solution annealing the cold rolled strip at a temperature generally within a range of 1550° F. and 1700° F. followed by rapid quenching, (vii) cold working the final annealed strip generally within a range of 0% and 90% to final thickness, and (viii) final age hardening the cold worked strip at a temperature generally within a range of 750° F. and 950° F. for a time generally within a range of 1 and 16 hrs.

In accordance with a further aspect of the present invention is a method of producing a lean beryllium-nickel-copper alloy with tin and zirconium and/or titanium additions represented by the formula (0.15–0.5% Be)+(0.40–1.25% Ni)+(0–0.25% Sn)+[(0.06–1% Zr) and/or (0.06–1% Ti)], the balance copper. As before, the sum of % Zr and % Ti is generally within a range of 0.06% and 1%. By this method, a composition represented by the formula is first melted, e.g. by induction, and cast into billets. Next, the billets are hot rolled into strip, and the strip cold-rolled to intermediate thickness. Intermediate annealing is performed on the cold rolled strip to improve bend formability. The annealed strip is then cold rolled to a selected ready-to-finish thickness. Thereafter, the cold rolled strip is final solution annealed at a temperature generally within a range of 1550° F. and 1700° F. followed by rapid quenching, and cold worked generally within a range of 0% and 90% to final thickness. Final age hardening is performed on the cold worked strip at a temperature generally within a range of 750° F. and 950° F. for a time generally within a range of 1 and 16 hrs.

More particularly, the billets are hot rolled to strip preferably about 0.3 in. to about 0.8 in. thick nominal. Also, the strip is air cooled (or, alternatively, water quenched) from a hot finishing temperature to room temperature after being rolled into coils on a hot mill. The coils may also be intermediate annealed at hot rolled thickness. The hot rolled coils are then preferably milled to remove any oxide scale, and cold rolled to ready-to-finish thickness on the order of about 0.020 in. The ready-to-finish thickness, by one definition, is the predetermined thickness (intended for application of a final solution annealing step) sufficient to allow a selected amount of additional cold work to a final thickness.

Optionally, second intermediate anneal and cleaning steps are performed part way through the cold rolling process between the milled thickness and ready-to-finish thickness.

The second annealing step may be inserted, alternatively, after hot rolling.

At ready-to-finish thickness, the coils are solution annealed at a temperature generally within a range of 1550° F. to 1700° F., as shown in Table I, followed by rapid quenching and chemical cleaning. Coils are then cold rolled 0% to about 60%, 80% or up to about 90% to final thickness. Final age hardening is preferably performed at a temperature generally within a range of 750° F. and 950° F. for about 1 hr. to about 16 hrs., preferably about 5 hrs., at such temperature.

Finally, selected strip samples are evaluated for tensile properties (0.2% offset yield strength, ultimate tensile strength and elongation), bend formability, electrical conductivity and stress relaxation resistance at about 175° C. for up to about 1000 hrs., at an initial stress of about 75% of the 0.2% offset yield strength.

Although the present invention is shown and described in connection with the production of strip, analogous processes may be practiced to produce the alloy in wire or rod form, within the spirit and scope of the present invention.

As shown in Table I, a yield strength lower than a desirable minimum, i.e., about 65 ksi for a low strength electronic connector or lead frame, were found in lean beryllium-nickel-copper alloys with compositions generally within a range of (0.12–0.31% Be)+(0.48–0.74% Ni), the balance copper, with optional Sn and/or Zr. This was also true where the alloy was processed with apparent combinations of insufficient annealing temperatures, e.g., about 1550° F. for the leanest Be contents, insufficient cold work, e.g., 0 to about 20%, and/or final age hardening at conditions considered to be either (i) under aged, e.g., at temperatures that are considered too low such as about 700° F., or for times believed too short to reach maximum possible aged strength, e.g., about 1 hr.; or (ii) over aged at, e.g., about 950° F., or for times such as about 8–16 hrs. so long that precipitates responsible for age hardening become coarse, resulting in irrecoverable loss of strength.

It has been found that yield strengths generally within a range from 65–93 ksi are achieved in the composition range (0.12–0.19) wt % Be, (0.48–0.76) wt % Ni, balance Cu and optional Sn and/or Zr, processed by annealing at about 1600° F.–about 1700° F., cold rolling up to about 20% and age hardening generally between 750° F. and 950° F. for about 5 hrs.

Yield strengths between about 65 and about 107 ksi are achieved in alloys in the range (0.22–0.34) wt % Be, (0.43–0.89) wt % Ni, the balance Cu and optional Sn and/or Zr, by the following process: annealing at a temperature generally within a range of 1550° F. and 1700° F., cold rolling up to about 90% to and age hardening at a temperature generally within a range of 750° F. –950° F. for about 1 hr. to about 16 hrs. Preferably, a time of at least about 5 hrs. is used for the lower aging temperatures of this range.

From about 65–120 ksi, yield strengths were achieved in alloys in the composition range (0.22–0.33) wt % Be, (1.04–1.22) wt % Ni, balance Cu and optional Sn and/or Zr, processed by annealing at a temperature between about 1550° F. and about 1700° F., cold rolling up to about 20% and age hardening between about 750° F.–950° F. for about 1 to about 16 hrs. Again, at least 5 hrs. is desired at aging temperatures low in this range.

Overall, the preferred lean beryllium-nickel-copper alloys, in accordance with various aspects of the present invention, were found to lie within the following nominal composition ranges: (0.1–0.4% Be)+(0.4–1.25% Ni), the balance Cu, with additions of (0.1–0.25% Sn nominal) and (0.15% Zr nominal).

Alloys which contain the full stated constituent ranges and are processed in accordance with the present invention, it has been found, meet or exceed the desired property combinations for representative strip tempers as follows:

(a) 65–85 ksi 0.2% offset yield strength with bend formability of 0.25–0.5 R/t in both "good way" and "bad way" bend directions (applicable to low strength electronic connectors and lead frames);

(b) 85–105 ksi yield strength with bend formability of 0.5–1.0 R/t in both bend directions (applicable to moderate strength electronic connectors and selected lead frames);

(c) 105–120 ksi yield strength with 1.0–1.5 R/t bend formability in both bend directions (applicable primarily to high strength electronic connectors);

(d) a minimum of 45–50 % IACS electrical conductivity at all strength levels; and (e) a minimum of 85–90% remaining stress in stress relaxation tests for 1,000 hrs. at 175° C. and an initial stress of 75% of the 0.2% offset yield strength.

Each composition and process combinations which met target yield strengths for each of the selected strip tempers also met target bend formability levels for the tempers. As Ni content approached about 1.22 wt %, the risk that electrical conductivity would fall below about 50% IACS increased. However, the alloys surveyed met the target minimum of about 45% IACS.

These lean beryllium-nickel-copper alloys also hot rolled satisfactorily. Additions of up to about 0.25 wt. % Sn, with or without Zr, had no apparent effect. Further, up to about 0.25 wt % Sn was tolerated at acceptable electrical conductivity of finish age hardened strip where no more than about 1.04 wt % Ni was present. When Ni content exceeded about 1.04 wt %, up to about 0.13 wt % Sn was tolerated in terms of acceptable finished strip electrical conductivity. In general, Sn additions seemed to have no impact upon yield strength, bend formability or stress relaxation resistance.

Finally, the addition of about 0.12–0.15 wt % Zr improved stress relaxation resistance at about 175° C. in the lean alloys to a level consistent with at least the lower desired target, e.g., about 85% remaining stress, established for the strip tempers selected. Even greater improvement in stress relaxation resistance was achieved, above the upper desired target, e.g., about 90% remaining stress, with additions of about 0.47% Zr or about 1.12% Zr as well as with addition of about 0.46% Ti or about 1% Ti. Absent Zr or Ti, this competitive advantage was not achieved. Also, the addition of up to about 0.15 wt % Zr was found to be of no consequence to yield strength or electrical conductivity, and had either no impact on, or was slightly beneficial to, bend formability. At about 1.12% Zr, some loss in strength and electrical conductivity was apparent, although within selected target ranges. Addition of about 0.46% Ti or about 1% Ti significantly reduced electrical conductivity and had a variable impact on strength.

Intermediate anneals at hot rolled thickness or at any thickness between hot rolled and ready-to-finish thickness improved bend formability at all strength levels of the finished strip. In addition, final age hardening at a temperature generally within a range of 750° F. and 850° F. provided greater resistance to stress relaxation than final age hardening at 950° F.

By traditional processing, the property combinations achieved are superior to competitive copper alloys such as C7025, C7026 and like heat treated copper-based alloys. In addition, these alloys provided improved electrical conductivity and "bad way" bend formability without sacrificing strength, as compared to C17410 lean beryllium-cobalt-copper alloys. Adding nominal 0.15% Zr to lean Be—Ni—Cu alloys yielded improvements in stress relaxation resistance at 175° C. so substantial that their relaxation behavior exceeded that of alloy C17410. It has also been discovered that the addition of up to about 0.25% Sn can be made to lean Be—Ni—Cu alloys without sacrificing hot rollability of cast billets and electrical conductivity for Ni contents up to nominal 1%. Above about 1% Ni, nominal 0.15% Sn was tolerated somewhat better in terms of electrical conductivity.

Turning now to the economic benefits, three factors are believed to contribute to the relatively lower cost of these alloys. First is their capacity to develop useful properties at reduced beryllium contents relative to those of prior beryllium-cobalt-copper alloys. Second, nickel rather than higher cost cobalt has been found workable as an alternative charge material. Finally, the combination of constituents of the present invention provides an apparently higher tolerance for impurity solid solution alloying elements, such as tin. This enables direct melting of Sn-plated scrap without the added expense of scrap detinning operations. Tin contamination in C17410 has been found to degrade electrical conductivity and make hot rolling more difficult.

A sum of % Zr and % Ti generally within a range of 0.06% and 1% has been found relatively important to operation and effectiveness of the present invention. For instance, below this range no measurable improvement in stress relaxation has been achieved. Above the range, age hardening response and/or electrical conductivity were found to be adversely affected.

Although the present invention is shown and described in connection with beryllium-nickel-copper alloys, it may be adapted for improving desirable characteristics of other precipitation hardenable materials such as aluminum-based alloys as well as copper or nickel-based alloys. Tin, according to at least one aspect of the present invention, may be excluded from the composition, giving consideration to the purpose for which the present invention is intended.

Other lean beryllium-copper alloys having enhanced stress relaxation resistance, at somewhat higher nickel content, have also been achieved. Alloys of this type are described, for example, in a co-pending U.S. patent application, filed on the same date herewith by John C. Harkness and Shelley J. Wolf, entitled "Lean, High Conductivity, Relaxation-Resistant Beryllium-Copper Alloys", the disclosure of which is hereby incorporated by reference in its entirety.

Various impurities, e.g., lead, iron, cobalt, chromium, silicon, aluminum, zinc, magnesium and silver are believed inherent in alloys of present invention, as will be appreciated by those skilled in the art.

The present invention advantageously eliminates the need for cobalt and reduces the amount of beryllium necessary, permitting cost-effective mass production of lead frames and connectors, while enhancing the performance characteristics of the alloys for electronic applications.

The alloy compositions illustrate increased resistance to stress relaxation associated with the addition of these specified amounts of zirconium and/or titanium. They also provide the benefit of tin-plated scrap consumption up to selected maximum tin levels to be cast into billet form, without the added expense of a scrap detinning step, yet retaining commercially desirable electrical conductivity and a high degree of hot workability.

Various modifications and alterations to the present invention may be appreciated based on a review of this disclosure. These changes and additions are intended to be within the scope and spirit of this invention as defined by the following claims.

What is claimed is:

1. A higher order beryllium-nickel-copper alloy consisting essentially of about 0.15 to 0.5% Be, about 0.40 to 1.25% Ni, about 0 to 0.25% Sn and about 0.06 to 1% Zr, Ti or both, the balance being copper, wherein the alloy has been age hardened without substantial overaging and exhibits a stress relaxation resistance after 1000 hours at 175° C. of about 86 to 97%, a yield strength of at least 65 ksi, an ultimate tensile strength of about 87 to 135 ksi, and an electrical conductivity of about 50 to 63% IACS.

2. The alloy of claim 1, wherein the alloy contains about 0.06 to 1% Zr and has been age hardened at about 700 to 850° F. for 1 to 16 hours.

3. The alloy of claim 2, wherein the alloy has been solution annealed and cold worked.

4. The alloy of claim 3, wherein the alloy is age hardened at about 750 to 850° F.

5. The alloy of claim 4, wherein the alloy is substantially peak aged.

6. The alloy of claim 2, wherein the alloy contains about 0.4 to 0.9% Ni.

7. The alloy of claim 6, wherein the alloy contains about 0.48 to 0.74% Ni.

8. The alloy of claim 6, wherein the alloy contains about 0.15 to 0.19% Be.

9. The alloy of claim 2, wherein the alloy contains about 0.15% Zr.

10. The alloy of claim 2, wherein the alloy is made by
   (a) cold rolling a strip of material having the composition of the alloy into a ready-to-finish thickness,
   (b) final solution annealing the cold rolled strip at about 1550 to 1700° F.,
   (c) cold rolling the strip to about 20 to 90% of its final thickness, and
   (d) age hardening the strip at about 700 to 850° F. for about 1 to 16 hours without substantial averaging.

11. The alloy of claim 10, wherein the alloy contains 0.06 to 1% Ti and is solution annealed, cold worked and age hardened without substantial overaging.

12. The alloy of claim 11, wherein the alloy is age hardened at about 700 to 850° F.

13. The alloy of claim 12, wherein the alloy is substantially peak aged.

14. The alloy of claim 12, wherein the alloy is cold worked at least about 20%.

15. The alloy of claim 11, wherein the alloy is made by
   (a) cold rolling a strip of material having the composition of the alloy into a ready-to-finish thickness,
   (b) final solution annealing the cold rolled strip at about 1550 to 1700° F.,
   (c) cold rolling the strip to about 20 to 90% of its final thickness, and
   (d) age hardening the strip at about 700 to 850° F. for about 1 to 16 hours without substantial overaging.

16. The alloy of claim 11, wherein the alloy contains 0.4 to 0.9% Ni.

17. An article of manufacture comprising a higher order beryllium-nickel-copper alloy consisting essentially of about 0.15 to 0.5% Be, about 0.40 to 1.25% Ni, about 0 to 0.25% Sn and about 0.06 to 1% Zr, the balance being copper, wherein the alloy has a stress relaxation resistance after 1000 hours at 175° C. of about 86 to 97%, a yield strength of at least 65 ksi, an ultimate tensile strength of about 87 to 135 ksi, and an electrical conductivity of about 50 to 63% IACS wherein the alloy is solution annealed, cold worked and age hardened without substantial overaging.

18. The article of claim 17, wherein the alloy is age hardened at about 700 to 850° F.

19. The article of claim 18, wherein the alloy is substantially peak aged.

20. The article of claim 18, wherein the alloy is cold worked at least about 20%.

21. The article of claim 17, wherein the article is a lead frame.

22. The article of claim 17, wherein the article is a current carrying spring.

23. The article of claim 17, wherein the alloy contains about 0.48 to 0.74% Ni.

24. The article of claim 23, wherein the alloy contains about 0.15% Zr.

25. An article of manufacture comprising a higher order beryllium-nickel-copper alloy-consisting essentially of about 0.15 to 0.5% Be, about 0.40 to 1.25% Ni, about 0 to 0.25% Sn and about 0.06 to 1% Ti, the balance being copper, wherein the alloy has a stress relaxation resistanie after 1000 hours at 175° C. of about 86 to 97%, a yield strength of at least 65 ksi, an ultimate tensile strength of about 87 to 135 ksi, and an electrical conductivity of about 50 to 63% IACS wherein the alloy is solution annealed, cold worked and age hardened without substantial overaging.

26. The article of claim 25, wherein the alloy is age hardened at about 700 to 850° F.

27. The article of claim 26, wherein the alloy is substantially peak aged.

28. The article of claim 26, wherein the alloy is cold worked at least about 20%.

29. The article of claim 25, wherein the article is a lead frame.

30. The article of claim 25, wherein the article is a current carrying spring.

31. The article of claim 25, wherein the alloy contains about 0.48 to 0.74% Ni.

32. The article of claim 31, wherein the alloy contains about 0.15% Zr.

* * * * *